(12) United States Patent
Lim

(10) Patent No.: US 9,667,238 B2
(45) Date of Patent: May 30, 2017

(54) DUTY CYCLE CORRECTION CIRCUIT AND IMAGE SENSING DEVICE INCLUDING THE SAME

(71) Applicant: SK hynix Inc., Gyeonggi-do (KR)

(72) Inventor: Sung-Chan Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 200 days.

(21) Appl. No.: 14/800,427

(22) Filed: Jul. 15, 2015

(65) Prior Publication Data

US 2016/0269014 A1  Sep. 15, 2016

(30) Foreign Application Priority Data

Mar. 12, 2015 (KR) .................. 10-2015-0034277

(51) Int. Cl.
- *H03K 5/156* (2006.01)
- *H04N 5/3745* (2011.01)
- *H04N 5/376* (2011.01)

(52) U.S. Cl.
CPC ......... *H03K 5/1565* (2013.01); *H04N 5/3765* (2013.01); *H04N 5/37455* (2013.01)

(58) Field of Classification Search
CPC . H03K 5/1565; H04N 5/37455; H04N 5/3765
USPC .................... 250/208.1, 214 DC; 327/175
See application file for complete search history.

(56) References Cited

U.S. PATENT DOCUMENTS

| | | | |
|---|---|---|---|
| 2007/0103216 A1* | 5/2007 | Han | H03K 5/1565 327/175 |
| 2007/0241799 A1* | 10/2007 | Minzoni | H03K 5/1565 327/175 |
| 2011/0025392 A1* | 2/2011 | Wu | H03K 5/1565 327/175 |
| 2016/0105065 A1* | 4/2016 | Takahashi | H02K 3/42 310/83 |

FOREIGN PATENT DOCUMENTS

| | | |
|---|---|---|
| KR | 1020090034762 | 4/2009 |
| KR | 1020110133781 | 12/2011 |

* cited by examiner

*Primary Examiner* — Seung C Sohn
(74) *Attorney, Agent, or Firm* — IP & T Group LLP

(57) ABSTRACT

A duty cycle correction circuit includes an inversion block suitable for generating a first inverted clock that is in an inversion relationship with a first clock and a second inverted clock that is in an inversion relationship with a second clock, in response to the first clock and the second clock, and a correction block suitable for generating a first corrected clock having a corrected duty cycle relative to the first clock and a second corrected clock having a corrected duty cycle relative to the second clock, based on a logic state of the first clock, a logic state of the second clock, a logic state of the first inverted clock, and a logic state of the second inverted clock.

20 Claims, 5 Drawing Sheets

| CLKP | CLKN | CLKPb | CLKNb | OUTP | OUTN |
|---|---|---|---|---|---|
| 0 | 0 | 1 | 1 | LATCH | LATCH |
| 0 | 1 | 1 | 0 | 0 | 1 |
| 1 | 0 | 0 | 1 | 1 | 0 |
| 1 | 1 | 0 | 0 | LATCH | LATCH |

DUTY CYCLE CORRECTION CIRCUIT AND IMAGE SENSING DEVICE INCLUDING THE SAME

CROSS-REFERENCE TO RELATED APPLICATIONS

The present application claims priority of Korean Patent Application No. 10-2015-0034277, filed on Mar. 12, 2015, which is incorporated herein by reference in its entirety.

BACKGROUND

1. Field

Exemplary embodiments of the present invention relate to a semiconductor design technology, and more particularly, to a duty cycle correction circuit and an image sensing device including the duty cycle correction circuit 2. Description of the Related Art Semiconductor devices use clocks to perform operations at specific times. For example, a semiconductor device may perform an operation based on one or both of the rising and falling edges of a clock.

Efforts to correct clock duty cycles have been made to improve operation margins and high-speed operations. The duty cycle of the clock is the ratio of the logic low level duration to the logic high level duration. It is important to precisely control the duty cycle of the clock to be 50:50 so that valid window regions of signals and data are secured. Clock duty cycle is an important factor in determining the performance of the semiconductor device.

Accordingly, semiconductor devices include a duty cycle correction circuit for correcting clock duty cycles. For example, a duty cycle correction circuit may correct the duty cycle of a clock outputted from a delay locked loop (DLL) a phase locked loop (PLL), a rising voltage controlled oscillator (VCO) and so on included in the semiconductor device at a ratio of 50 to 50. The corrected clock having a duty cycle of 50:50 becomes the basis for stable circuit operations.

However, duty cycle correction circuits generally require a large amount of circuit area, have complicated structures, and have high current consumption.

Semiconductor devices may also include an image sensing device, and the image sensing device may include a duty cycle correction circuit for using a double data rate (DDR) scheme. For example, the image sending device may perform a counting operation based on the DDR scheme using a clock for converting a pixel signal outputted from a pixel into a digital signal. In order to properly perform the counting operation based on the DDR scheme, it is important to use a clock having a duty cycle of 50 to 50.

An image sensing device captures images using the photosensitive properties of semiconductors. Image sensing devices may be classified into charge coupled device CCD) image sensors and complementary metal oxide semiconductor (CMOS) image sensors. CMOS image sensors have come into widespread use. This is because CMOS image sensors allow analog circuits and digital control circuits to be directly implemented on a single integrated circuit (IC).

SUMMARY

Exemplary embodiments of the present invention are directed to a duty cycle correction circuit that may correct duty cycles of a first clock and a second clock, which is phase-shifted by approximately 180 degrees from the first clock, and an image sensing device including the duty cycle correction circuit.

In accordance with an embodiment of the present invention, a duty cycle correction circuit includes an inversion block suitable for generating a first inverted clock that is in an inversion relationship with a first clock and a second inverted clock that is in an inversion relationship with a second clock, in response to the first clock and the second clock, and a correction block suitable for generating a first corrected clock having a corrected duty cycle relative to the first clock and a second corrected clock having a corrected duty cycle relative to the second clock, based on a logic state of the first clock, a logic state of the second clock, a logic state of the first inverted clock, and a logic state of the second inverted clock.

The second clock may be shifted in phase by approximately 180 degrees from the first clock.

The correction block may generate the first and second corrected clocks corresponding to current logic states of the first and second clocks, respectively, when logic states of the first and second clocks are different, and logic states of the first and second inverted clocks are different, and the correction block may generate the first and second corrected clocks corresponding to previous logic states of the first and second clocks, respectively, when the logic states of the first and second clocks are the same, and the logic states of the first and second inverted clocks are the same.

In accordance with an embodiment of the present invention, a duty cycle correction circuit includes a first inversion unit suitable for inverting a first clock and generating a first inverted clock, a second inversion unit suitable for inverting a second clock and generating a second inverted clock, wherein the second clock is shifted in phase from the first clock, a first phase correction unit suitable for generating a first corrected clock having a corrected duty cycle relative to the first clock and a second corrected clock having a corrected duty cycle relative to the second clock, based on a logic state of the first clock, a logic state of the second clock, a logic state of the first inverted clock, and a logic state of the second inverted clock; and a second phase correction unit suitable for maintaining a logic state of the first corrected clock and a logic state of the second corrected clock.

The second clock may be shifted in phase by approximately 180 degrees from the first clock.

The first phase correction unit enabled to generate the first and second corrected clocks corresponding to the current logic states of the first and second clocks, respectively, when the logic states of the first and second clocks are different, and logic states of the first and second inverted clocks are different.

The second phase correction unit suitable for maintaining logic states of the first and second corrected clocks to correspond to the current logic states of the first and second clocks, respectively, when the logic states of the first and second clocks are different, and the logic states of the first and second inverted clocks are different.

The first phase correction unit may be disabled when the logic state of the first clock and the logic state of the second clock are the same, and the logic state of the first inverted clock and the logic state of the second inverted clock are the same.

The second phase correction unit may maintain the logic states of the first and second corrected clocks to correspond to the previous logic states of the first and second clocks, respectively, when the logic states of the first and second clocks are the same, and the logic states of the first and second inverted clocks are the same.

The first phase correction unit may include a first driving section suitable for driving an output terminal of the first corrected clock and an output terminal of the second corrected clock with high voltage in response to the first clock and the second clock, a first coupling control section suitable for electrically connecting or disconnecting a high voltage terminal to/from the first driving section in response to the first inverted clock and the second inverted clock, a second driving section suitable for driving the output terminal of the first corrected clock and the output terminal of the second corrected clock with low voltage in response to the first inverted clock and the second inverted clock, and a second coupling control section suitable for electrically connecting or disconnecting a low voltage terminal to/from the second driving section in response to the first clock and the second clock.

The second phase correction unit may include a latch coupled between an output terminal of the first corrected clock and an output terminal of the second corrected clock.

In accordance with an embodiment of the present invention, an image sensing device includes: a duty cycle correction circuit suitable for generating a first corrected clock having a corrected duty cycle relative to a first clock and a second corrected clock having a corrected duty cycle relative to a second clock, based on a logic state of the first clock, a logic state of the second clock, a logic state of a first inverted clock which is an inverted signal of the first clock, and a logic state of a second inverted clock which is an inverted signal of the second clock, a controller suitable for generating an operation control signal, a pixel array suitable for generating a pixel signal in response to the operation control signal, and an analog-to-digital converter suitable for converting the pixel signal into a digital signal in response to one or more among the first corrected clock and the second corrected clock.

The first clock and the second clock may be generated based on a source clock, and the second clock may be shifted in phase by approximately 180 degrees from the first clock.

The duty cycle correction circuit may include a first inversion unit suitable for inverting the first clock and generating the first inverted clock, a second inversion unit suitable for inverting the second clock and generating the second inverted clock, a first phase correction unit suitable for generating the first corrected clock in response to the second clock and the first inverted clock and the second corrected clock in response to the first clock and the second inverted clock, and a second phase correction unit suitable for maintaining a logic state of the first corrected clock and a logic state of the second corrected clock.

The first phase correction unit may be enabled to generate the first and second corrected clocks corresponding to current logic states of the first and second clocks, respectively, when the logic states of the first and second clocks are different, and the logic states of the first and second inverted clocks are different.

The second phase correction unit may maintain the logic states of the first and second corrected clocks to correspond to the current logic states of the first and second clocks, respectively, when the logic states of the first and second clocks are different, and the logic states of the first and second inverted clocks are different.

The first phase correction unit may be disabled when the logic state of the first clock and the logic state of the second clock are the same, and the logic state of the first inverted clock and the logic state of the second inverted clock are the same.

The second phase correction unit may maintain the logic states of the first and second corrected clocks to correspond to previous logic states of the first and second clocks, respectively, when the logic states of the first and second clocks are the same, and the logic states of the first and second inverted clocks are the same.

The first phase correction unit may include a first driving section suitable for driving an output terminal of the first corrected clock and an output terminal of the second corrected clock with high voltage in response to the first clock and the second clock, a first coupling control section suitable for electrically connecting or disconnecting a high voltage terminal to/from the first driving section in response to the first inverted clock and the second inverted clock, a second driving section suitable for driving the output terminal of the first corrected clock and the output terminal of the second corrected clock with low voltage in response to the first inverted clock and the second inverted clock, and a second coupling control section suitable for electrically connecting or disconnecting a low voltage terminal to/from the second driving section in response to the first clock and the second clock.

The second phase correction unit may include a latch coupled between an output terminal of the first corrected clock and an output terminal of the second corrected clock.

DETAILED DESCRIPTION

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

It is also noted that in this specification, "connected/coupled" refers to one component not only directly coupling another component but also indirectly coupling another component through an intermediate component. In addition, the singular form may include the plural form as long as it is not specifically mentioned otherwise.

Figure 1:
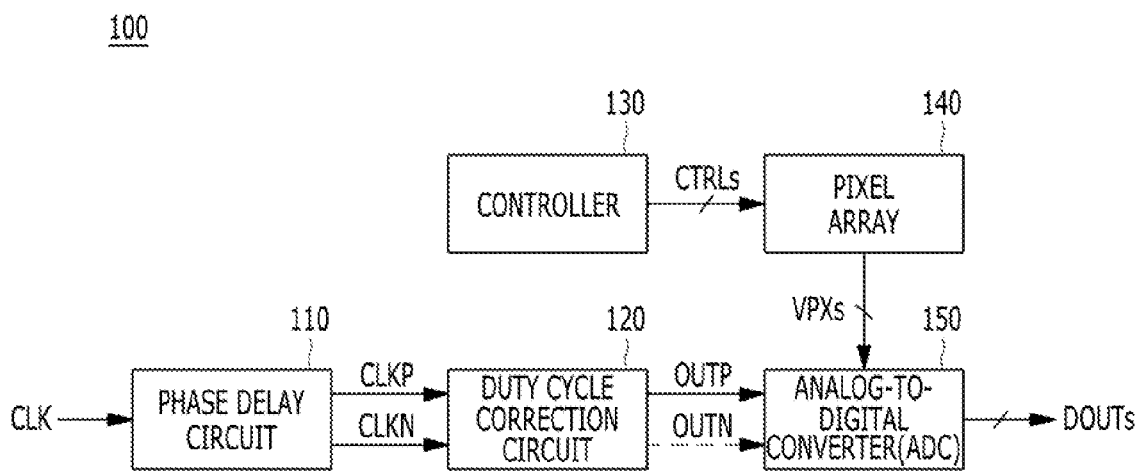
FIG. 1 is a block diagram illustrating an image sensing device in accordance with an embodiment of the present invention.

FIG. 1 is a block diagram illustrating an image sensing device in accordance with an embodiment of the present invention.

Referring to FIG. 1, an image sensing device 100 may include a phase delay circuit 110, a duty cycle correction circuit 120, a controller 130 a pixel array 140, and an analog-to-digital converter 150.

The phase delay circuit 110 may generate a first clock CLKP and a second clock CLKN in response to a source clock CLK. For example, the phase delay circuit 110 may generate the first clock CLKP having the same phase as the source clock CLK and the second clock CLKN which is phase-shifted by approximately 180 degrees from the source clock CLK or the first clock CLKP.

Although not illustrated in the drawings, the source clock. CLK may be outputted from a clock generation circuit such as a phase locked loop (PLL). The source clock CLK may be distorted due to defects in the clock generation circuit or loads in its transmission line. Accordingly, the first and second clock CLKP and CLKN may not have required duty cycles therebetween.

The duty cycle correction circuit 120 may generate a first corrected clock OUTP having a corrected duty cycle relative to the first clock CLKP and a second corrected clock OUTN having a corrected duty cycle relative to the second clock CLKN, based on a logic relationship between the first clock CLKP and the second clock CLKN.

The controller 130 may generate a plurality of operation control signals CTRLs. For example, the operation control signals CTRLs may include transmission signals, reset signals, and selection signals for each row of the pixel array 140 in order to control the operation of each row of the pixel array 140.

The pixel array 140 may include a plurality of pixels (not shown in the drawing) arranged in rows and columns. The pixels may generate a plurality of pixel signals VPXs on a row-by-row basis in response to the operation control signals CTRLs.

The analog-to-digital converter 150 may convert the pixel signals VPXs into a plurality of digital signals DOUTs based on the first corrected clock OUTP and the second corrected clock OUTN. Or, the analog-to-digital converter 150 may convert the pixel signals VPXs into the digital signals DOUTs based on just the first corrected clock OUTP. For example, the analog-to-digital converter 150 may perform a counting operation based on a DDR scheme in response to at least one among the first corrected clock OUTP and the second corrected clock OUTN, thereby converting the pixel signals VPXs into the digital signals DOUTs Although not illustrated in FIG. 1, the image sensing device 100 may further include a clock conversion circuit. For example, the clock conversion circuit may divide the first corrected clock OUTP and the second corrected clock OUTN at a predetermined division ratio and supply a first divided clock and a second divided clock to the analog-to-digital converter 150. The analog-to-digital converter 150 may use at least one among the first divided clock and the second divided clock in lieu of the first corrected clock OUTP and the second corrected clock OUTN.

Figure 2:
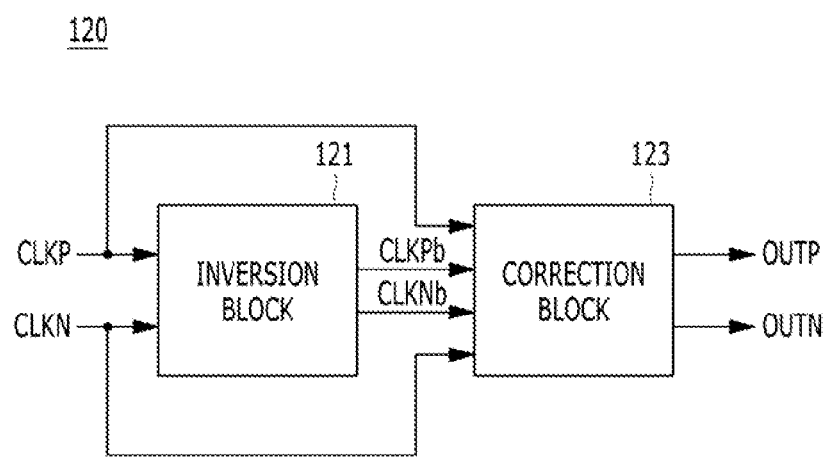
FIG. 2 is a block diagram illustrating a duty cycle correction circuit shown in FIG. 1.

FIG. 2 is a block diagram illustrating the duty cycle correction circuit 120 shown in FIG. 1.

Referring to FIG. 2, the duty cycle correction circuit 20 may include an inversion block 121 and a correction block 123.

The inversion block 121 may generate a first inverted clock CLKPb which is in an inversion relationship with the first clock CLKP and a second inverted clock CLKNb which is in an inversion relationship with the second clock CLKN, in response to the first clock CLKP and the second clock CLKN. For example, the inversion block 121 may generate the first inverted clock CLKPb by inverting the first clock CLKP and the second inverted clock CLKNb by inverting the second clock CLKN.

The correction block 123 may generate the first corrected clock OUTP having a corrected duty cycle relative to the first clock CLKP and the second corrected clock OUTN having a corrected duty cycle relative to the second clock CLKN, based on the logic states of the first and second clocks CLKP and CLKN, and the first and second inverted clocks CLKPb and CLKNb. For example, the correction block 123 may generate the first and second corrected clocks OUTP and OUTN corresponding to the current logic states of the first and second clocks CLKP and CLKN, respectively, when the logic states of the first and second clocks CLKP and CLKN are different, and the logic states of the first and second inverted clocks CLKPb and CLKNb are different. The correction block 123 may generate the first and second corrected clocks OUTP and OUTN corresponding to the previous logic states of the first and second clocks CLKP and CLKN, respectively, when the logic states of the first and second clocks CLKP and CLKN are the same, and the logic states of the first and second inverted clocks CLKPb and CLKNb are the same.

Figure 3:
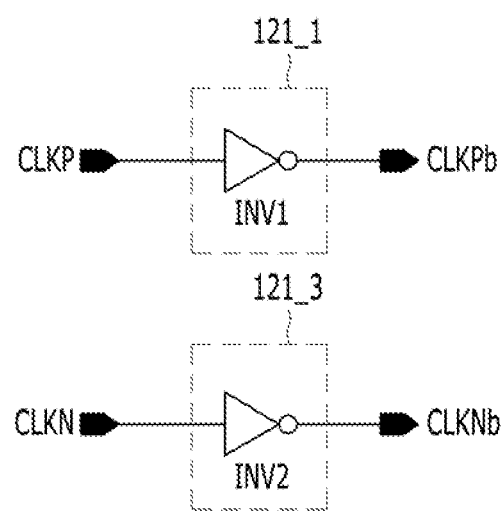
FIG. 3 is a circuit diagram illustrating an inversion block shown in FIG. 2.

FIG. 3 is a circuit diagram illustrating the inversion block 121 shown in FIG. 2.

Referring to FIG. 3, the inversion block 121 may include a first inversion unit 121_1 and a second inversion unit 121_3.

The first inversion unit 121_1 may invert the first clock CLKP and output the first inverted clock CLKPb. For example, the first inversion unit 121_1 may include a first inverter INV1.

The second inversion unit 121_3 may invert the second clock CLKN and output the second inverted clock CLKNb. For example, the second inversion unit 121_3 may include a second inverter INV2.

Figure 4:
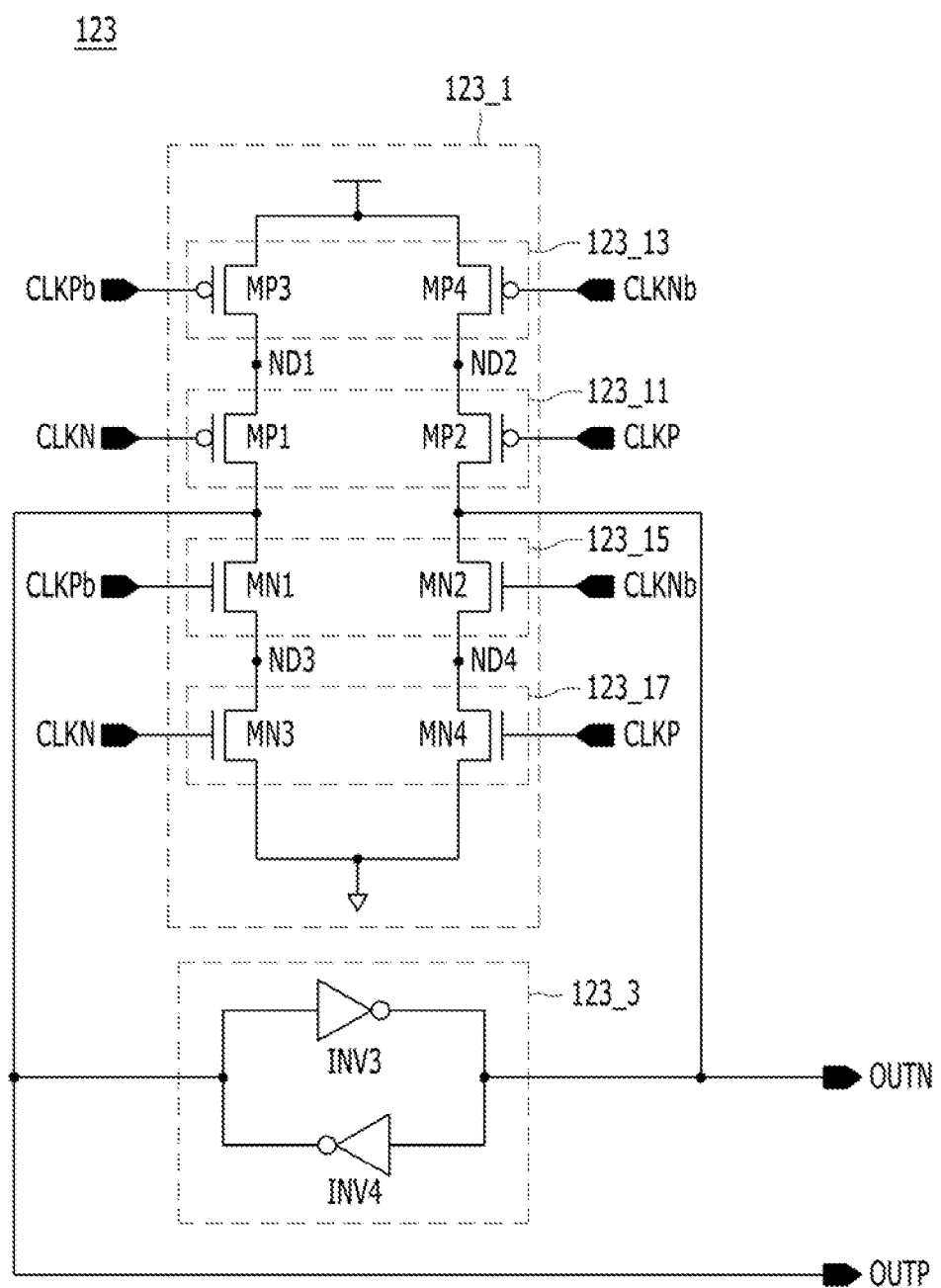
FIG. 4 is a circuit diagram illustrating a correction block shown in FIG. 2.

FIG. 4 is a circuit diagram illustrating the correction block 123 shown in FIG. 2.

Referring to FIG. 4, the correction block 123 may include a first phase correction unit 123_1 and a second phase correction unit 123_3.

The first phase correction unit 123_1 may be enabled when the logic states of the first and second clocks CLKP and CLKN are different, and the logic states of the first and second inverted clocks CLKPb and CLKNb are different. The first phase correction unit 123_1 may be disabled when the logic states of the first and second clocks CLKP and CLKN are the same, and the logic states of the first and second inverted clocks CLKPb and CLKNb are the same. When the first phase correction unit 123_1 is enabled, the first phase correction unit 123_1 may generate the first corrected clock OUTP corresponding to the current logic state of the first clock CLKP and the second corrected clock OUTN corresponding to the current logic state of the second clock CLKN.

In other words, the first phase correction unit 123_1 may generate the first corrected clock OUTP in response to the second clock CLKN and the first inverted clock CLKPb and the second corrected clock OUTN in response to the first clock CLKP and the second inverted clock CLKNb. For example, the first phase correction unit 123_1 may include a first driving section 123_11, a first coupling control section 123_13 a second driving section 123_15, and a second coupling control section 123_17.

The first driving section 123_11 may drive an output terminal of the first corrected clock OUTP and an output terminal of the second corrected clock OUTN with a high voltage in response to the first clock CLKP and the second clock CLKN. The high voltage may be transmitted by the first coupling control section 123_13. For example, the first driving section 123_11 may include a first PMOS transistor MP1 and a second PMOS transistor MP2. The first PMOS transistor MP1 may have a gate that is coupled to an input terminal of the second clock CLKN and a source and a drain that are coupled between a first node ND1 and the output terminal of the first corrected clock OUTP. The second PMOS transistor MP2 may have a gate that is coupled to an input terminal of the first clock CLKP and a source and a drain that are coupled between a second node ND2 and the output terminal of the second corrected clock OUTN.

The first coupling control section 123_13 may electrically connect or disconnect a high voltage terminal to/from the first driving section 123_11 in response to the first inverted clock CLKPb and the second inverted clock CLKNb. For example, the first coupling control section 123_13 may include a third PMOS transistor MP3 and a fourth PMOS transistor MP4. The third PMOS transistor MP3 may have a gate that is coupled to an input terminal of the first inverted clock CLKPb and a source and a drain that are coupled between the high voltage terminal and the first node ND1. The fourth PMOS transistor MP4 may have a gate that is coupled to an input terminal of the second inverted clock CLKNb and a source and a drain that are coupled between the high voltage terminal and the second node ND2.

The second driving section 123_15 may drive the output terminal of the first corrected clock OUTP and the output terminal of the second corrected clock OUTN with a low voltage in response to the first inverted clock CLKPb and the second inverted clock CLKNb. The low voltage may be transmitted by the second coupling control section 123_17. For example, the second driving section 123_15 may include a first NMOS transistor MN1 and a second NMOS transistor MN2. The first NMOS transistor MN1 may have a gate that is coupled to the input terminal of the first inverted clock CLKPb and a source and a drain that are coupled between a third node ND3 and the output terminal of the first corrected clock OUTP. The second NMOS transistor MN2 may have a gate that is coupled to the input terminal of the second inverted clock CLKNb and a source and a drain that are coupled between a fourth node ND4 and the output terminal of the second corrected clock OUTN.

The second coupling control section 123_17 may electrically connect or disconnect a low voltage terminal to/from the second driving section 123_15 in response to the first clock CLKP and the second clock CLKN. For example, the second coupling control section 123_17 may include a third NMOS transistor MN3 and a fourth NMOS transistor MN4. The third NMOS transistor MN3 may have a gate that is coupled to the input terminal of the second clock CLKN and a source and a drain that are coupled between the low voltage terminal and the third node ND3. The fourth NMOS transistor MN4 may have a gate that is coupled to the input terminal of the first clock CLKP and a source and a drain that are coupled between the low voltage terminal and the fourth node ND4.

The second phase correction unit 123_3 may maintain the logic state of the first clock CLKP and the logic state of the second clock CLKN. In other words, when the first phase correction unit 123_1 enabled, the second phase correction unit 123_3 may maintain the logic state of the first corrected clock OUTP to correspond to the current logic state of the first clock CLKP and the logic state of the second corrected clock OUTN to correspond to a current logic state of the second clock CLKN. When the first phase correction unit 123_1 is disabled, the second phase correction unit 123_3 may maintain the logic state of the first corrected clock OUTP to correspond to the previous logic state of the first clock CLKP and the logic state of the second corrected clock OUTN to correspond to the previous logic state of the second clock CLKN.

For example, the second phase correction unit 123_3 may include a latch INV3 and INV4 that is coupled between the output terminal of the first corrected clock OUTP and the output terminal of the second corrected clock OUTN.

Hereinafter, an operation of the image sensing device 100 having the aforementioned structure in accordance with the embodiment of the present invention is described.

Figure 5:
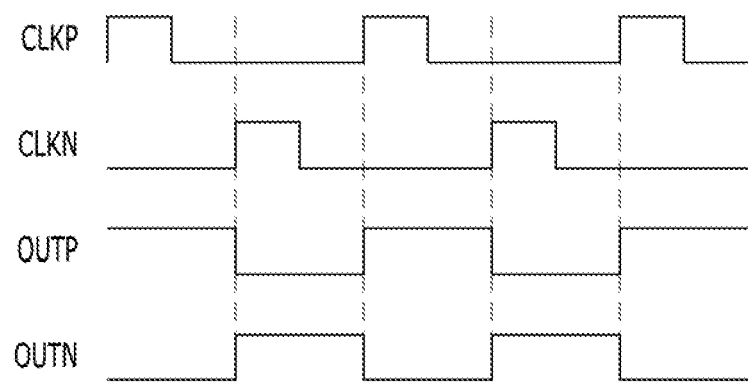
FIG. 5 is a timing diagram for describing an operation of the duty cycle correction circuit based on a first example shown in FIG. 1.
Figures 6, 7:
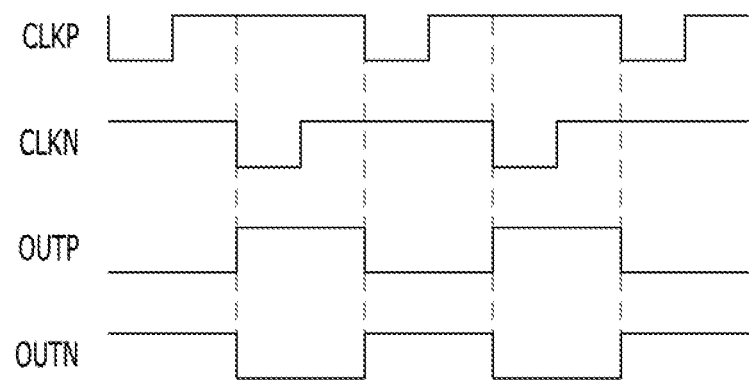
FIG. 6 is a timing diagram for describing an operation of the duty cycle correction circuit based on a second example shown in FIG. 1.
FIG. 7 is a truth table for describing an operation of the duty cycle correction circuit shown in FIG. 1.

FIG. 5 is a timing diagram for describing an operation of the duty cycle correction circuit 120 included in the image sensing device 100 based on a first example. FIG. 6 is a timing diagram for describing an operation of the duty cycle correction circuit 120 included in the image sensing device 100 based on a second example. FIG. 7 is a truth table for describing the operation of the duty cycle correction circuit 120.

Referring to FIGS. 5 and 7, the duty cycle correction circuit 120 may generate the first corrected clock OUTP having a corrected duty cycle relative to the first clock CLKP and the second corrected clock OUTN having a corrected duty cycle relative to the second clock CLKN, based on logic relationships between the first clock CLKP and the second clock CLKN. The operation of the duty cycle correction circuit 120 is described below in detail.

The inversion block 121 may invert the first clock CLKP and generate the first inverted clock CLKPb, and it may invert the second clock CLKN and generate the second inverted clock CLKNb.

The correction block 123 may generate the first corrected clock OUTP and the second corrected clock OUTN based on the logic states of the first and second clocks CLKP and CLKN, and the first and second inverted clocks CLKPb and CLKNb For example, the correction block 123 may generate the first corrected clock OUTP corresponding to the current logic state of the first clock CLKP and the second corrected clock OUTN corresponding to the current logic state of the second clock CLKN when the logic state of the first clock CLKP and the logic state of the second clock CLKN are different.

When the logic states of the first clock CLKP, the second clock CLKN, the first inverted clock CLKPb, and the second inverted clock CLKNb are "1", "0", "0" and "1", respectively, the logic states of the first corrected clock OUTP and the second corrected clock OUTN may be "1" and "0", respectively. This is because the first PMOS transistor MP1 and the third PMOS transistor MP3 among the first to fourth PMOS transistors MP1 to MP4 included in the correction block 123 may be turned on, and consequently the output terminal of the first corrected clock OUTP may be driven with a high voltage. Also, this is because the second NMOS transistor MN2 and the fourth NMOS transistor MN4 among the first to fourth NMOS transistors MN1 to MN4 included in the correction block 123 may be turned on, and consequently the output terminal of the second corrected clock OUTN may be driven with a low voltage.

When the logic states of the first clock CLKP, the second clock CLKN, the first inverted clock CLKPb, and the second inverted clock CLKNb are "0", "1", "1" and "0", respectively, the logic states of the first corrected clock OUTP and the second corrected clock OUTN may be "0" and "1", respectively. This is because the first NMOS transistor MN1 and the third NMOS transistor MN3 may be turned on, and consequently the output terminal of the first corrected clock OUTP may be driven with the low voltage. Also, this is because the second PMOS transistor MP2 and the fourth PMOS transistor MP4 may be turned on, and consequently the output terminal of the second corrected clock OUTN may be driven with the high voltage.

The correction block 123 may generate the first corrected clock OUTP corresponding to the previous logic state of the first clock CLKP and the second corrected clock OUTN corresponding to the previous logic state of the second clock CLKN when the logic state of the first clock CLKP and the logic state of the second clock CLKN are the same.

When the logic states of the first clock CLKP, the second clock CLKN, the first inverted clock CLKPb, and the second inverted clock CLKNb are "0", "0", "1" and "1", respectively, the logic states of the first corrected clock OUTP and the second corrected clock OUTN may be "1" and "0", respectively, or "0" and "1", respectively. This is because the third and fourth PMOS transistors MP3 and MP4, and the third and fourth NMOS transistors MN3 and MN4 included in the correction block 123 may be turned off, and consequently the output terminal of the first corrected clock OUTP and the output terminal of the second corrected clock OUTN may maintain the previous logic states based on the latch INV3 and INV4.

Ideally, the duty cycle ratio of the first clock CLKP should be 50:50, and the duty cycle ratio of the second clock CLKN should be 50:50. Then, since there is a phase difference of approximately 180 degrees between the first clock CLKP and the second clock CLKN, the logic state of the first clock CLKP and the logic state of the second clock CLKN should be in inversion relationships with each other. Since the duty cycle of the first clock CLKP is not 50:50, and the duty cycle of the second clock CLKN is not 50:50 in actuality, the first clock CLKP and the second clock CLKN may partly have a non-inversion relationship with each other. Therefore, when the non-inversion relationship may be changed to the inversion relationship, the duty cycle of the first clock CLKP and the duty cycle of the second clock. CLKN may be corrected.

Referring to FIGS. 6 and 7, the duty cycle correction circuit 120 may generate the first corrected clock OUTP having a corrected duty cycle relative to the first clock CLKP and the second corrected clock OUTN having a corrected duty cycle relative to the second clock CLKN, based on the logic relationships between the first clock CLKP and the second clock CLKN. The operation of the duty cycle correction circuit 120 is described below in detail.

The inversion block 121 may invert the first clock CLKP and generate the first inverted clock CLKPb, and it may invert the second clock CLKN and generate the second inverted clock CLKNb.

The correction block 123 may generate the first corrected clock OUTP and the second corrected clock OUTN based on the logic states of the first and second clocks CLKP and CLKN, and the first and second inverted clocks CLKPb and CLKNb.

For example, the correction block 123 may generate the first corrected clock OUTP corresponding to the current logic state of the first clock CLKP and the second corrected clock OUTN corresponding to the current logic state of the second clock CLKN when the logic state of the first clock CLKP and the logic state of the second clock CLKN are different.

When the logic states of the first clock CLKP, the second clock CLKN, the first inverted clock CLKPb, and the second inverted clock. CLKNb are "1", "0" "0" and "1" respectively, the logic states of the first corrected clock OUTP and the second corrected clock OUTN may be "1" and "0" respectively. This is because the first PMOS transistor MP1 and the third PMOS transistor MP3 among the first to fourth PMOS transistors MP1 to MP4 included in the correction block 123 may be turned on, and consequently the output terminal of the first corrected clock OUTP may be driven with a high voltage. Also, this is because the second NMOS transistor MN2 and the fourth NMOS transistor MN4 among the first to fourth NMOS transistors MN1 to MN4 included in the correction block 123 may be turned on, and consequently the output terminal of the second corrected clock OUTN may be driven with a low voltage.

When the logic states of the first clock CLKP, the second clock CLKN, the first inverted clock CLKPb, and the second inverted clock CLKNb are "0", "1" "1" and "0", respectively, the logic states of the first corrected clock OUTP and the second corrected clock OUTN may be "0" and "1", respectively. This is because the first NMOS transistor MN1 and the third NMOS transistor MN3 may be turned on, and consequently the output terminal of the first corrected clock OUTP may be driven with the low voltage. Also, this is because the second PMOS transistor MP2 and the fourth PMOS transistor MP4 may be turned on, and consequently the output terminal of the second corrected clock OUTN may be driven with the high voltage.

The correction block 123 may generate the first corrected clock OUTP corresponding to the previous logic state of the first clock. CLKP and the second corrected clock OUTN corresponding to the previous logic state of the second clock CLKN when the logic state of the first clock CLKP and the logic state of the second clock CLKN are the same.

When the logic states of the first clock CLKP, the second clock CLKN, the first inverted clock CLKPb, and the second inverted clock CLKNb are "1", "1", "0" and "0" respectively, the logic states of the first corrected clock OUTP and the second corrected clock OUTN may be "1" and respectively, or "0" and "1", respectively. This is because the first and second PMOS transistors MP1 and MP2, and the first and second NMOS transistors MN1 and MN2 included in the correction block 123 may be turned off, and consequently the output terminal of the first corrected clock OUTP and the output terminal of the second corrected clock OUTN may maintain the previous logic states based on the latch INV3 and INV4.

Under these circumstances, when the controller 130 generates the operation control signals CTRLs, the pixel array 140 may generate the pixel signals VPXs on a basis of rows.

The analog-to-digital converter 150 may count the pixel signals VPXs and convert the pixel signals VPXs into digital signals DOUTs. For example, the analog-to-digital converter 150 may perform a counting operation based on the DDR scheme using at least one among the first corrected clock OUTP and the second corrected clock OUTN.

In accordance with the embodiments of the present invention, a clock whose duty cycle is corrected may be generated based on a simple circuit. Also, a stable counting operation may be performed based on the corrected clock.

Furthermore, in accordance with the embodiments of the present invention, the duty cycle of a first clock and the duty cycle of a second clock that is phase-shifted by approximately 180 degrees from the first clock may be corrected based on a simple circuit. Accordingly, the size of an area occupied by a duty cycle correction circuit may be minimized.

Furthermore, in accordance with the embodiments of the present invention, the operation reliability may be improved based on the corrected clock.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

For example, although it is described in the embodiments of the present invention that an analog-to-digital converter (ADC) uses a corrected clock, the inventive concept is not limited to this, and the present invention may be applicable to other circuits using a clock such as an interface circuit.

Also, although an image sensing device is described in the embodiments of the present invention, the inventive concept is not limited to this, and the present invention may be applicable to other devices that use a clock.

What is claimed is:

1. A duty cycle correction circuit, comprising:
   an inversion block suitable for generating a first inverted clock that is in an inversion relationship with a first clock and a second inverted clock that is in an inversion relationship with a second clock, in response to the first clock and the second clock; and
   a correction block suitable for generating a first corrected clock having a corrected duty cycle relative to the first clock and a second corrected clock having a corrected duty cycle relative to the second clock, based on a logic state of the first clock, a logic state of the second clock, a logic state of the first inverted clock, and a logic state of the second inverted clock.

2. The duty cycle correction circuit of claim 1, wherein the second clock is shifted in phase by approximately 180 degrees from the first clock.

3. The duty cycle correction circuit of claim 1, wherein the correction block generates the first and second corrected clocks corresponding to current logic states of the first and second clocks, respectively, when logic states of the first and second clocks are different, and logic states of the first and second inverted clocks are different, and
   the correction block generates the first and second corrected clocks corresponding to previous logic states of the first and second clocks, respectively, when the logic states of the first and second clocks are the same, and the logic states of the first and second inverted clocks are the same.

4. A duty cycle correction circuit, comprising:
   a first inversion unit suitable for inverting a first clock and generating a first inverted clock;
   a second inversion unit suitable for inverting a second clock and generating a second inverted clock, wherein the second clock is shifted in phase from the first clock;
   a first phase correction unit suitable for generating a first corrected clock having a corrected duty cycle relative to the first clock and a second corrected clock having a corrected duty cycle relative to the second clock, based on a logic state of the first clock, a logic state of the second clock, a logic state of the first inverted clock, and a logic state of the second inverted clock; and
   a second phase correction unit suitable for maintaining a logic state of the first corrected clock and a logic state of the second corrected clock.

5. The duty cycle correction circuit of claim 4, wherein the second clock is shifted in phase by approximately 180 degrees from the first clock.

6. The duty cycle correction circuit of claim 4, wherein the first phase correction enabled to generate the first and second corrected clocks corresponding to the current logic states of the first and second clocks, respectively, when the logic states of the first and second clocks are different, and logic states of the first and second inverted clocks are different.

7. The duty cycle correction circuit of claim 6, wherein the second phase correction unit suitable for maintaining logic states of the first and second corrected clocks to correspond to the current logic states of the first and second clocks, respectively, when the logic states of the first and second clocks are different, and the logic states of the first and second inverted clocks are different.

8. The duty cycle correction circuit of claim 4, wherein the first phase correction unit is disabled when the logic state of the first clock and the logic state of the second clock are the same, and the logic state of the first inverted clock and the logic state of the second inverted clock are the same.

9. The duty cycle correction circuit of claim 7, wherein the second phase correction unit maintains the logic states of the first and second corrected clocks to correspond to the previous logic states of the first and second clocks, respectively, when the logic states of the first and second clocks are the same, and the logic states of the first and second inverted clocks are the same.

10. The duty cycle correction circuit of claim 6, wherein the first phase correction unit includes:
    a first driving section suitable for driving an output terminal of the first corrected clock and an output terminal of the second corrected clock with high voltage in response to the first clock and the second clock;
    a first coupling control section suitable for electrically connecting or disconnecting a high voltage terminal to/from the first driving section in response to the first inverted clock and the second inverted clock;
    a second driving section suitable for driving the output terminal of the first corrected clock and the output terminal of the second corrected clock with low voltage in response to the first inverted clock and the second inverted clock; and
    a second coupling control section suitable for electrically connecting or disconnecting a low voltage terminal to/from the second driving section in response to the first clock and the second clock.

11. The duty cycle correction circuit of claim 4, wherein the second phase correction unit includes:
    a latch coupled between an output terminal of the first corrected clock and an output terminal of the second corrected clock.

12. An image sensing device, comprising:
    a duty cycle correction circuit suitable for generating a first corrected clock having a corrected duty cycle relative to a first clock and a second corrected clock having a corrected duty cycle relative to a second clock, based on a logic state of the first clock, a logic state of the second clock, a logic state of a first inverted clock which is an inverted signal of the first clock, and a logic state of a second inverted clock which is an inverted signal of the second clock;

a controller suitable for generating an operation control signal;

a pixel array suitable for generating a pixel signal in response to the operation control signal; and an analog-to-digital converter suitable for converting the pixel signal into a digital signal in response to one or more among the first corrected clock and the second corrected clock.

13. The image sensing device of claim 12, wherein the first clock and the second clock are generated based on a source clock, and the second clock is shifted in phase by approximately 180 degrees from the first clock.

14. The image sensing device of claim 12, wherein the duty cycle correction circuit includes:

a first inversion unit suitable for inverting the first clock and generating the first inverted clock;

a second inversion unit suitable for inverting the second clock and generating the second inverted clock;

a first phase correction unit suitable for generating the first corrected clock in response to the second clock and the first inverted clock and the second corrected clock in response to the first clock and the second inverted clock; and a second phase correction unit suitable for maintaining a logic state of the first corrected clock and a logic state of the second corrected clock.

15. The image sensing device of claim 14, wherein the first phase correction unit is enabled to generate the first and second corrected clocks corresponding to current logic states of the first and second clocks, respectively, when the logic states of the first and second clocks are different, and the logic states of the first and second inverted clocks are different.

16. The image sensing device of claim 15, wherein the second phase correction unit maintains the logic states of the first and second corrected clocks to correspond to the current logic states of the first and second clocks, respectively, when the logic states of the first and second clocks are different, and the logic states of the first and second inverted clocks are different.

17. The image sensing device of claim 14, wherein the first phase correction unit is disabled when the logic state of the first clock and the logic state of the second clock are the same, and the logic state of the first inverted clock and the logic state of the second inverted clock are the same.

18. The image sensing device of claim 17, wherein the second phase correction unit maintains the logic states of the first and second corrected clocks to correspond to previous logic states of the first and second clocks, respectively, when the logic states of the first and second clocks are the same, and the logic states of the first and second inverted clocks are the same.

19. The image sensing device of claim 14, wherein the first phase correction unit includes:

a first driving section suitable for driving an output terminal of the first corrected clock and an output terminal of the second corrected clock with high voltage in response to the first clock and the second clock;

a first coupling control section suitable for electrically connecting or disconnecting a high voltage terminal to/from the first driving section in response to the first inverted clock and the second inverted clock;

a second driving section suitable for driving the output terminal of the first corrected clock and the output terminal of the second corrected clock with low voltage in response to the first inverted clock and the second inverted clock; and a second coupling control section suitable for electrically connecting or disconnecting a low voltage terminal to/from the second driving section in response to the first clock and the second clock.

20. The image sensing device of claim 14, wherein the second phase correction unit includes:

a latch coupled between an output terminal of the first corrected clock and an output terminal of the second corrected clock.

* * * * *